United States Patent
Rahafrooz et al.

(10) Patent No.: US 11,358,858 B2
(45) Date of Patent: Jun. 14, 2022

(54) SEMICONDUCTOR DEVICE AND METHOD OF MANUFACTURING THEREOF

(71) Applicant: Panasonic Intellectual Property Management Co., Ltd., Osaka (JP)

(72) Inventors: Amir Rahafrooz, Shaker Heights, OH (US); Thomas Kieran Nunan, Carlisle, MA (US); Diego Emilio Serrano, Peachtree, GA (US); Ijaz Jafri, Holliston, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/751,567

(22) Filed: Jan. 24, 2020

(65) Prior Publication Data

US 2021/0229978 A1 Jul. 29, 2021

(51) Int. Cl.
*B81B 3/00* (2006.01)
*B81C 1/00* (2006.01)
*G01C 19/5719* (2012.01)

(52) U.S. Cl.
CPC ........ *B81B 3/0021* (2013.01); *B81C 1/00531* (2013.01); *B81B 2201/0242* (2013.01); *G01C 19/5719* (2013.01)

(58) Field of Classification Search
CPC .......... B81B 3/0021; B81B 2201/0242; B81B 2203/033; B81C 1/00531; B81C 1/00619; B81C 2201/0132; B81C 1/00579; B81C 1/00571

See application file for complete search history.

(56) References Cited

U.S. PATENT DOCUMENTS

| 4,985,114 | A | 1/1991 | Okudaira et al. |
| 5,474,650 | A | 12/1995 | Kumihashi et al. |
| 5,498,312 | A | 3/1996 | Laermer et al. |
| 5,501,893 | A | 3/1996 | Laermer et al. |
| 6,284,148 | B1 | 9/2001 | Laermer et al. |
| 6,291,875 | B1 * | 9/2001 | Clark .................. G01P 15/0802 257/622 |
| 6,531,068 | B2 | 3/2003 | Laermer et al. |
| 7,023,065 | B2 | 4/2006 | Ayazi et al. |
| 7,543,496 | B2 | 6/2009 | Ayazi et al. |

(Continued)

OTHER PUBLICATIONS

International Search Report of PCT application No. PCT/JP2021/000202 dated Apr. 6, 2021.

*Primary Examiner* — Yasser A Abdelaziez
(74) *Attorney, Agent, or Firm* — Pearne & Gordon LLP

(57) ABSTRACT

A method of manufacturing a semiconductor device includes providing a semiconductor layer having a first-type region and a second-type region that are stacked and interface with each other to form a p-n junction, the first-type region defining a first side of the semiconductor layer and the second-type region defining a second side of the semiconductor layer. The method further includes providing an insulating layer on the second side of the semiconductor layer and etching the semiconductor layer from the first side of the semiconductor layer toward the second side of the semiconductor layer to form a trench. The first-type region corresponds to one of a n-type region and a p-type region, and the second-type region corresponds to the other of the n-type region and the p-type region.

26 Claims, 5 Drawing Sheets

(56) References Cited

U.S. PATENT DOCUMENTS

| | | |
|---|---|---|
| 7,578,189 B1 | 8/2009 | Mehregany |
| 7,892,876 B2 | 2/2011 | Mehregany |
| 8,166,816 B2 | 5/2012 | Ayazi et al. |
| 8,173,470 B2 | 5/2012 | Mehregany |
| 8,372,677 B2 | 2/2013 | Mehregany |
| 8,528,404 B2 | 9/2013 | Ayazi |
| 2005/0095814 A1 | 5/2005 | Zhu et al. |
| 2007/0026636 A1 | 2/2007 | Gogoi |
| 2012/0161254 A1* | 6/2012 | Kautzsch ............ G01L 19/0636 257/415 |
| 2012/0313067 A1 | 12/2012 | Lee et al. |
| 2013/0336037 A1 | 12/2013 | Chen et al. |
| 2017/0271446 A1* | 9/2017 | Joshi .................. H01L 29/1095 |

* cited by examiner

SEMICONDUCTOR DEVICE AND METHOD OF MANUFACTURING THEREOF

FIELD OF THE INVENTION

This application relates generally to a semiconductor device and more particularly, a MEMS sensor device such as a gyroscope or accelerometer.

BACKGROUND OF THE INVENTION

Sensor devices, such as gyroscopes and accelerometers, provide high-precision sensing. However, historically their cost, size, and power requirements have prevented their widespread use in industries such as consumer products, gaming devices, automobiles, and handheld positioning systems.

More recently, micro-electro-mechanical systems (MEMS) sensor devices have been gaining increased attention from multiple industries since micro-machining technologies have made fabrication of miniature gyroscopes and accelerometers possible. Miniaturization also enables integration of MEMS devices with readout electronics on the same die, resulting in reduced size, cost, and power consumption as well as improved resolution by reducing noise. Consumer products such as digital cameras, 3D gaming equipment, and automotive sensors are employing MEMS devices because of their numerous advantages. The demand for low cost, more sophisticated, and user-friendly devices by the consumers has caused a steep rise in the demand of MEMS sensors, as they offer adequate reliability and performance at very low prices.

State-of-the-art MEMS devices, such as those disclosed in U.S. Pat. Nos. 7,578,189; 7,892,876; 8,173,470; 8,372,677; 8,528,404; 7,543,496; and 8,166,816, are able to sense rotational (i.e. angle or angular velocity of rotation around an axis) or translational motion (i.e. linear acceleration along an axis) around and along axes. Techniques for manufacturing such devices using a process known as High Aspect Ratio Poly and Single Silicon (HARPSS) are disclosed in, for example, U.S. Pat. No. 7,023,065 entitled Capacitive Resonators and Methods of Fabrication by Ayazi, et al., and other publications.

One example technique is illustrated in FIG. 3 herein, wherein a semiconductor-on-insulator (SOI) wafer 300 is provided that includes an insulating layer 302 comprising silicon dioxide, a semiconductor layer 304 comprising silicon that is stacked on top of the insulating layer 302, and a passivation layer 306 comprising silicon dioxide that is stacked on top of the semiconductor layer 304 and defines one or more openings 308 that expose the semiconductor layer 304 from above.

A vertical trench 310 is formed in the semiconductor layer 304 by a reactive ion etching process, such as an inductively-coupled plasma (ICP) deep reactive ion etching (DRIE) process. During this etching process, positively charged ions accelerate toward the semiconductor layer 304 through the openings 308 of the passivation layer 306 due to the existence of an electric field. The ions form the trench 310 as they pass through the semiconductor layer 304 toward the insulating layer 302. However, as the trench 310 reaches the insulating layer 302 and exposes the insulating layer 302, the positively charged ions start charging the exposed insulating layer 302. As a result, subsequent ions accelerating toward the insulating layer 302 deviate to the sides of the trench 310 creating a footing 312 (i.e., notch) in the semiconductor side wall. This footing 312 creates asymmetry in the trench 310 that can degrade performance of the final sensor.

For instance, in case of an in-plane accelerometer or gyroscope, where the structure needs to move in the in-plane (XY) direction, such asymmetry can create unwanted out-of-plane (Z) movement and degrade the performance. As another example, in electrostatic devices where the vertical trench 310 is filled in the center to create a nano-gap along its side walls, the width of the nano-gap can be considerably smaller in the footing 312 and also both in-plane and out-of-plane movements will be limited by the footing 312 creating reliability issues.

BRIEF SUMMARY OF THE INVENTION

The following presents a simplified summary of example embodiments of the invention. This summary is not intended to identify critical elements of the invention or to delineate the scope of the invention. The sole purpose of the summary is to present some example embodiments in simplified form as a prelude to the more detailed description that is presented later.

In accordance with a first aspect, a method of manufacturing a semiconductor device includes providing a semiconductor layer having a first-type region and a second-type region that are stacked and interface with each other to form a p-n junction, the first-type region defining a first side of the semiconductor layer and the second-type region defining a second side of the semiconductor layer; providing an insulating layer on the second side of the semiconductor layer; and etching the semiconductor layer from the first side of the semiconductor layer toward the second side of the semiconductor layer to form a trench. The first-type region corresponds to one of a n-type region and a p-type region, and the second-type region corresponds to the other of the n-type region and the p-type region.

In one example of the first aspect, the first-type region corresponds the p-type region and the second-type region corresponds to the n-type region.

In another example of the first aspect, the second-type region has a thickness that is equal to or less than a maximum depletion width of the second-type region.

In yet another example of the first aspect, the semiconductor layer comprises silicon.

In still yet another example of the first aspect, the method comprises providing a handle substrate, forming the insulating layer on one of the handle substrate and the second side of the semiconductor layer, and then bonding the insulating layer to the other of the handle substrate and the second side of the semiconductor layer such that the handle substrate and semiconductor layer are arranged on opposite sides of the insulating layer. In one example, the handle substrate is a silicon wafer.

In another example of the first aspect, the step of providing the semiconductor layer comprises providing the first-type region, and forming the second-type region on the first-type region by ion implantation, diffusion, or epitaxy.

In yet another example of the first aspect, the method comprises providing a masking layer on the first side of the semiconductor layer prior to etching the semiconductor layer, and the masking layer partially covers the first side while leaving one or more other portions of the first side exposed.

In still yet another example of the first aspect, the step of etching the semiconductor layer divides the semiconductor layer into a first semiconductor substrate and a second semiconductor substrate that are spaced apart by the trench, the first semiconductor substrate and second semiconductor substrate respectively having a first sidewall and second sidewall that define the trench. In one example, the method comprises coating the first side wall and second side wall respectively with a first oxide layer and second oxide layer, and then filling the trench with a conductive material.

In accordance with a second aspect, a semiconductor device includes a handle substrate; a first semiconductor substrate provided on the handle substrate, the first semiconductor substrate having a first-type portion and a second-type portion that are stacked and interface with each other to form a first substrate p-n junction; and a second semiconductor substrate provided on the handle substrate, the second semiconductor substrate having another first-type portion and another second-type portion that are stacked and interface with each other to form a second substrate p-n junction. The first-type portions of the first semiconductor substrate and second semiconductor substrate each correspond to one of a p-type portion and a n-type portion, and the second-type portions of the first semiconductor substrate and second semiconductor substrate each correspond to the other of the p-type portion and n-type portion. Moreover, the first semiconductor substrate and the second semiconductor substrate are spaced apart by a trench.

In one example of the second aspect, the first semiconductor substrate and the second semiconductor substrate each comprises silicon.

In another example of the second aspect, the trench has a width with a maximum variance that is 0.5 µm or less.

In yet another example of the second aspect, the trench is filled with a conductive material.

In still yet another example of the second aspect, the first-type portions of the first semiconductor substrate and second semiconductor substrate have the substantially same doping level, and the second-type portions of the first semiconductor substrate and second semiconductor substrate have the substantially same doping level.

In another example of the second aspect, the second-type portions of the first semiconductor substrate and second semiconductor substrate each has a thickness that is equal to or less than its maximum depletion width.

In yet another example of the second aspect, a gyroscope includes the semiconductor device, wherein the first semiconductor substrate forms a resonator of the gyroscope and the second semiconductor substrate forms an electrode of the gyroscope. In one example, the first semiconductor substrate has a first side portion and the second semiconductor substrate has a second side portion that forms a capacitor with the first side portion. In one example, a capacitive gap is provided between the first side portion of the first semiconductor substrate and the second side portion of the second semiconductor substrate.

It is to be understood that both the foregoing general description and the following detailed description present example and explanatory embodiments. The accompanying drawings are included to provide a further understanding of the described embodiments and are incorporated into and constitute a part of this specification. The drawings illustrate various example embodiments.

BRIEF DESCRIPTION OF THE DRAWINGS

The foregoing and other aspects of the present invention will become apparent to those skilled in the art to which the present invention relates upon reading the following description with reference to the accompanying drawings, in which.

DETAILED DESCRIPTION

Figure 1A:
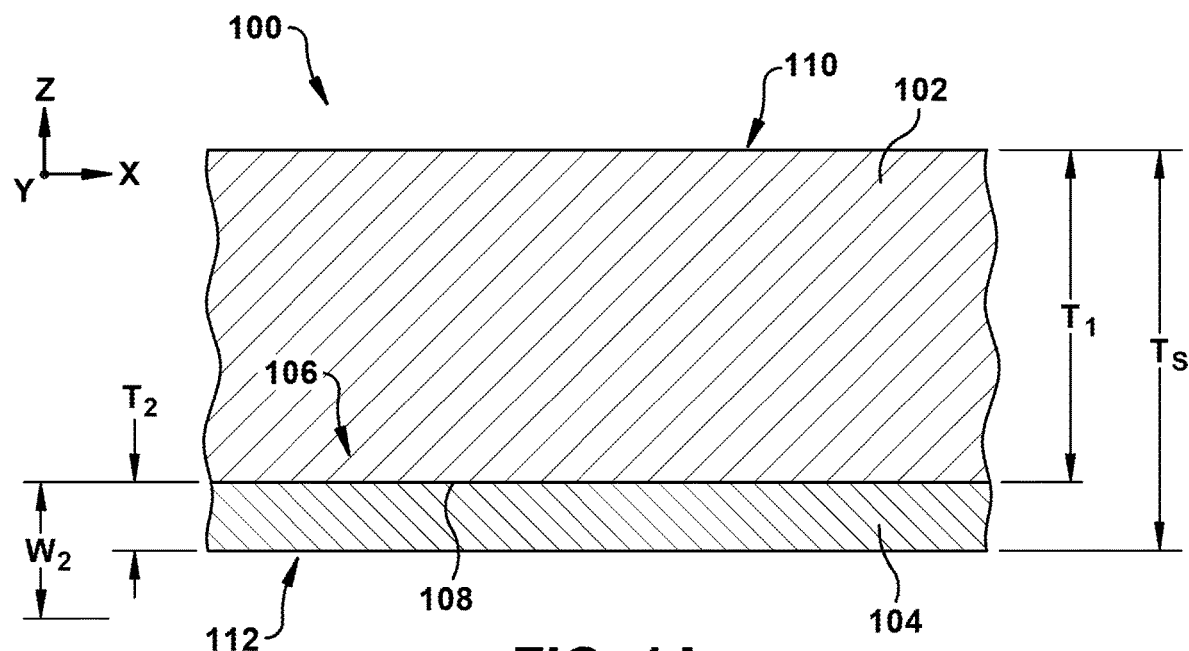
FIG. 1A is a schematic cross-section view illustrating a step of providing a semiconductor layer.

Example embodiments are described and illustrated in the drawings. These illustrated examples are not intended to be a limitation on the present invention. For example, one or more aspects can be utilized in other embodiments and even other types of devices. Moreover, certain terminology is used herein for convenience only and is not to be taken as a limitation. Still further, in the drawings, the same reference numerals are employed for designating the same elements.

An example method of manufacturing a semiconductor device will now be described with reference to the drawings. As will be apparent later below, the semiconductor device manufactured in the present example corresponds to a MEMS gyroscope. However, it is to be appreciated that one or more steps of the method described below can be used to manufacture other semiconductor devices such as, for example, a MEMS accelerometer.

Turning to FIG. 1A, the method includes a first step of providing a semiconductor layer 100 having a first-type region 102 and a second-type region 104 that form a p-n junction 106 at their interface 108. In particular, the first-type region 102 corresponds to a p-type region while the second-type region 104 corresponds to a n-type region. Moreover, the first-type region 102 defines a first side 110 of the semiconductor layer 100, while the second-type region defines a second side 112 of the semiconductor layer 100. However, the first-type region 102 can correspond to the n-type region while the second-type region 104 corresponds to the p-type region in other examples.

Each region 102, 104 comprises a semiconductor material (e.g., silicon, germanium, gallium nitride, Zinc oxide, etc.) that can be doped with impurities (e.g., boron, gallium, phosphorous, and/or arsenic) to provide a higher hole concentration (for a p-type region) or a higher electron concentration (for a n-type region). For example, the first-type region 102 and second-type region 104 in the illustrated example each comprise single-crystalline silicon. The first-type region 102 is doped with boron and/or gallium to provide a higher hole concentration than electron concentration, while the second-type region 104 is doped with phosphorous and/or arsenic to provide a higher electron concentration than hole concentration. However, other semiconductor and/or doping materials can be used in other examples.

The semiconductor layer 100 in the present example is formed by first providing the first-type region 102 and then forming the second-type region 104 on the first-type region 102 by ion implantation, diffusion, or epitaxy. However, in other examples the semiconductor layer 100 can be formed by first providing the second-type region 104 and then forming the first-type region 102 on the second-type region 104 by ion implantation, diffusion, or epitaxy. Moreover, in some examples the first-type region 102 and second-type region 104 can be separately formed and then bonded together to form the semiconductor layer 100.

The first-type region 102 and second-type region 104 can define a Z axis along which they are stacked, wherein the Z axis extends substantially orthogonal to the plane along which they interface. The first-type region 102 and second-type region 104 can further define an X axis and a Y axis that are both substantially parallel to the plane along which they interface, wherein the X axis and Y axis are orthogonal to each other and the Z axis. Moreover, the first-type region 102, second-type region 104, and semiconductor layer 100 (as a whole) will respectively have thicknesses $T_1$, $T_2$, $T_s$ that are measured along the Z axis and can vary by embodiment. For instance, the thickness $T_1$ of the first-type region 102 can be from about 2 μm to about 100 μm, the thickness $T_2$ of the second-type region 104 can be from about 0.2 μm to about 5 μm, and the overall thickness $T_s$ of the semiconductor layer 100 can be from about 20 μm to about 3 mm. However, other thicknesses $T_1$, $T_2$, $T_s$ are possible in some examples.

Typically, each region of a p-n junction will have a "depletion zone", which is a portion of the region along its interface with the other region wherein the majority charge carriers of the region (i.e., holes for a p-type region and electrons for a n-type region) are depleted due to diffusion of those charge carriers to the other region. The range of distance from the interface at which its majority charge carriers are depleted is commonly referred to as a "depletion width" and varies based on, for example, the doping levels of each region. However, a region can be so thin that its maximum depletion width (for the purposes of this disclosure, a "maximum depletion width" of a region refers to a theoretical maximum range of distance from its interface with the other region in which its majority charge carriers would be depleted) is equal to or greater than its actual thickness, meaning that the entire region will be depleted along its interface with the other region.

For reasons discussed further below, the thickness $T_2$ of the second-type region 104 in the present method will preferably be equal to or less than its maximum depletion width $W_2$, such that the entire second-type region 104 is depleted. The following formulas can be used to calculate the maximum depletion width $W_2$ of the second-type region 104:

$$\epsilon = \epsilon_0 * \epsilon_r, \quad (1) \text{ Permittivity:}$$

wherein $\epsilon_0 = 8.854*10^{-12}$ As/Vm and $\epsilon_r$ is permittivity of the second-type region 104 (e.g., 11.9 for silicon);

$$\text{Built-in voltage: } V_{bi} = \frac{k_B * T}{e} * \ln\left(\frac{N_1 * N_2}{n_i^2}\right), \quad (2)$$

wherein $N_1$ is the doping level of the first-type region 102 in 1/cm³, $N_2$ is the doping level of the second-type region 104 in 1/cm³, $n_i$ is the electron concentration and the hole concentration of the second-type region's material when undoped (e.g., $1.5*10^{10}$/cm³ for silicon), $k_B$ is $1.38*10^{-23}$ J/K, T is temperature in K, and e is $1.602*10^{-19}$ As;

$$\text{Maximum depletion width (no external bias): } W = \sqrt{\frac{2 * \epsilon * (N_1 + N_2) * V_{bi}}{e * N_1 * N_2}} \text{; and} \quad (3)$$

$$\text{Maximum depletion width of second-type region: } W_2 = \frac{N_1 * W}{N_1 + N_2} \quad (4)$$

However, in some examples the thickness $T_2$ of the second-type region 104 can be greater than its maximum depletion width $W_2$, such that only a portion of the second-type region 104 will be depleted. Indeed, the thicknesses $T_1$, $T_2$ of the first-type region 102 and second-type region 104 can be variety of different thicknesses without departing from the scope of this disclosure.

Figure 1B:
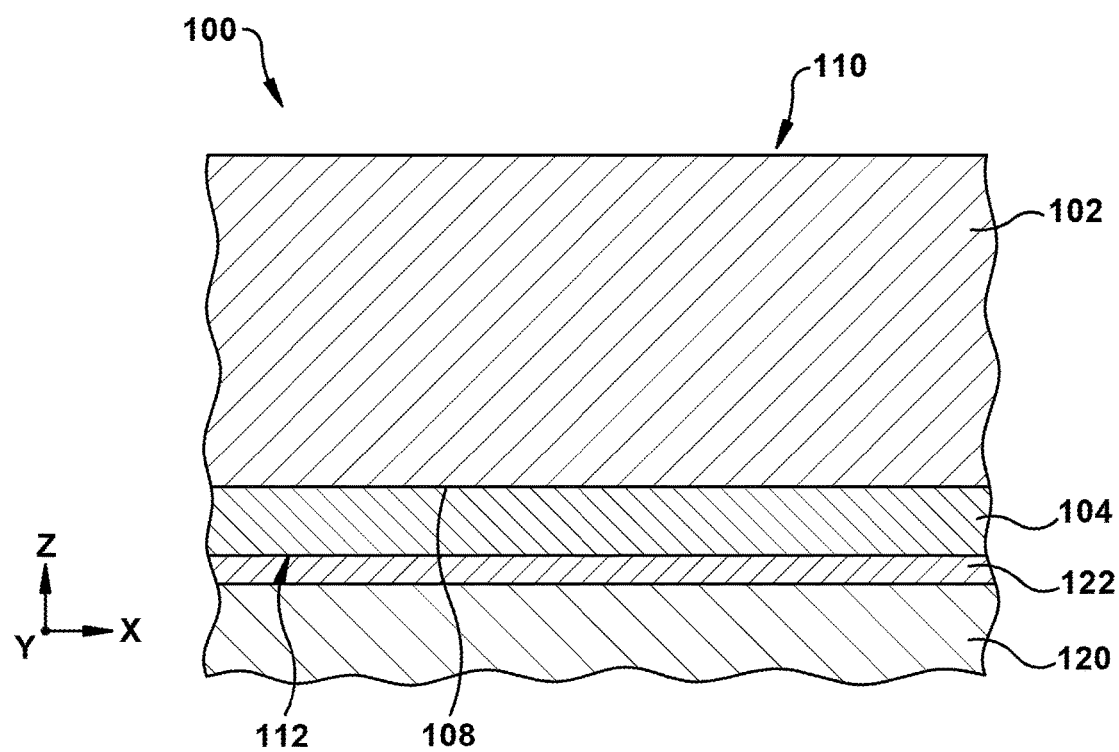
FIG. 1B is a schematic cross-section view illustrating a step of stacking an insulating layer and handle substrate on the semiconductor layer.

Turning to FIG. 1B, the method can include providing a handle substrate 120 and an insulating layer 122 and stacking them along the Z axis relative to the semiconductor layer 100 such that the handle substrate 120 and semiconductor layer 100 are on opposite sides of the insulating layer 122, with the insulating layer 122 being arranged on the second side 112 of the semiconductor layer 100. The insulating layer 122 preferably comprises an insulating material such as silicon dioxide, silicon nitrite, and preferably has a resistivity of 1 kΩ·cm or greater. Meanwhile, the handle substrate 120 can comprise a silicon wafer in some examples. However, the insulating layer 122 and handle substrate 120 can comprise other materials without departing from the scope of the disclosure.

To arrange the handle substrate 120 and insulating layer 122 accordingly, the method can include forming the insulating layer 122 on one of the handle substrate 120 and the second side 112 of the semiconductor layer 100, and then bonding the insulating layer 122 to the other of the handle substrate 120 and the second side 112 of the semiconductor layer 100. For example, in the illustrated example the insulating layer 122 is grown on the handle substrate 120 via a dry or wet oxidation process. Then, a side of the insulating layer 122 opposite to the handle substrate 120 is bonded to the second side 112 of the semiconductor layer 100 via fusion bonding. However, the process in which the insulating layer 122 is formed and/or bonded can vary in other embodiments. Moreover, the insulating layer 122 can be alternatively formed on the second side 112 of the semiconductor layer 100 and then bonded to the handle substrate 120 in some examples.

Figure 1C:
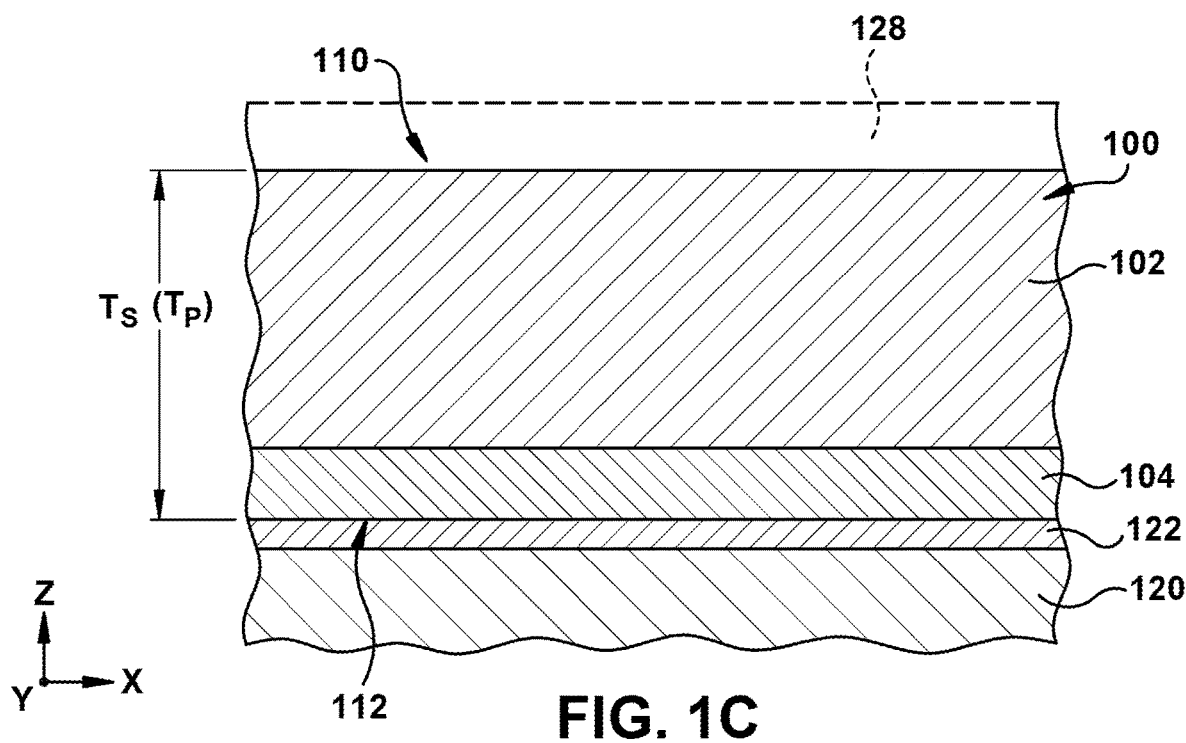
FIG. 1C is a schematic cross-section view illustrating a step of removing a portion of the semiconductor layer.

The insulating layer 122, handle substrate 120, and semiconductor layer 100 once stacked together will form an integral structure. Such integration of the semiconductor layer 100 with the handle substrate 120 can make it easier to perform subsequent processing of the semiconductor layer 100 that may have otherwise been more difficult to perform without the handle substrate 120. For example, as shown in FIG. 1C, a portion 128 of the semiconductor layer 100 can be subsequently removed (e.g., via grinding) to reduce its thickness $T_s$ to a predetermined, desired thickness Tp. However, it is to be appreciated that this portion 130 could be removed before integration of the semiconductor layer 100 and handle substrate 120 in some examples. Moreover, the portion 128 may be retained in some examples.

Figure 1D:
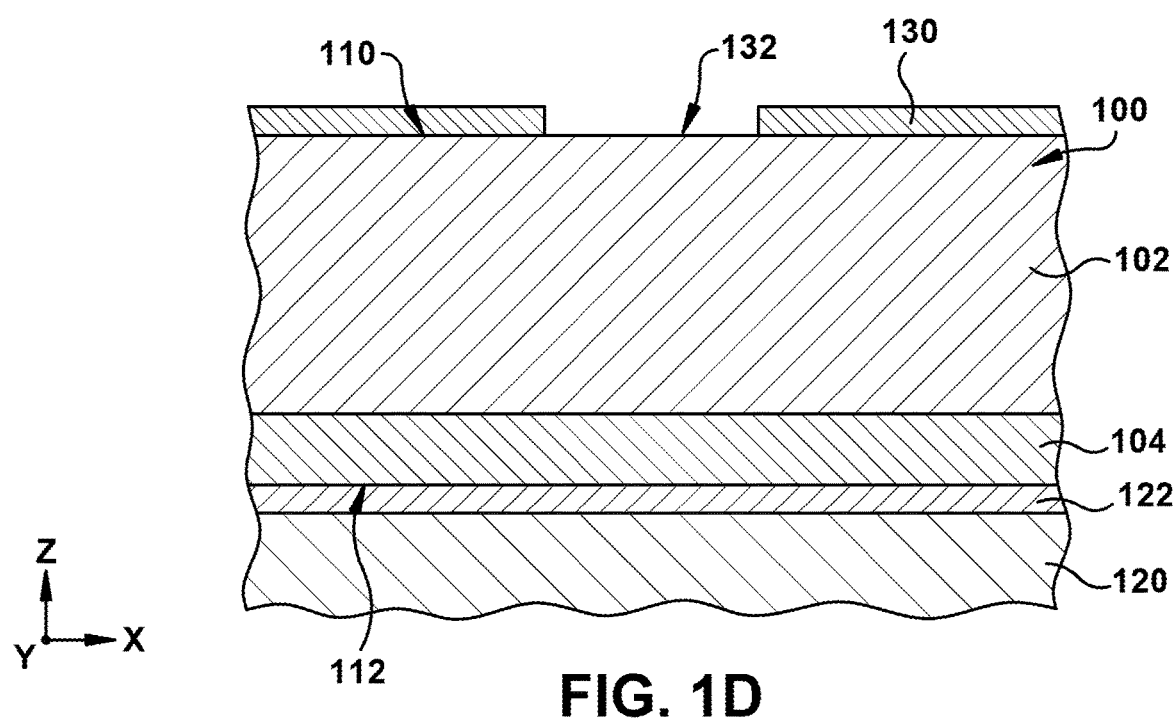
FIG. 1D is a schematic cross-section view illustrating a step of applying a masking layer to the semiconductor layer.

Turning to FIG. 1D, the method can further include providing a masking layer 130 on the first side 110 of the semiconductor layer 100. The masking layer 130 preferably comprises an insulating material such as silicon dioxide or sapphire, and preferably has a resistivity of 1 kΩ·cm or greater. Moreover, the masking layer 130 can be grown on the first side 110 via, e.g., a dry or wet oxidation process or chemical vapor deposition. However, other materials and/or processes may be used in other embodiments. Once formed, the masking layer 130 will partially cover the first side 110 while leaving one or more portions 132 of the first side 110 exposed (when viewed from a direction parallel to the Z axis and aimed toward the first side 110).

Figure 1E:
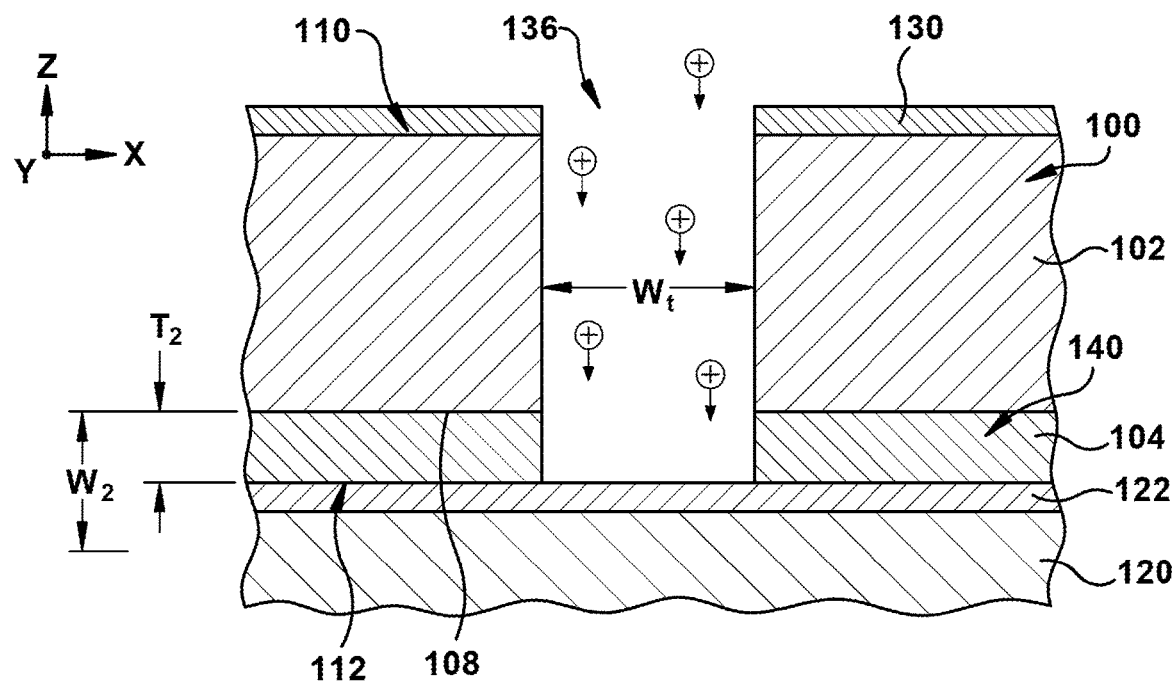
FIG. 1E is a schematic cross-section view illustrating a step of etching the semiconductor layer to form a trench.

After the masking layer 130 is provided on the first side 110 of the semiconductor layer 100, the method can include a step of etching the semiconductor layer 100 to form a trench 136 that extends through the semiconductor layer 100, as shown in FIG. 1E. More specifically, the semiconductor layer 100 can be etched from its first side 110 toward its second side 112 along the Z axis using a reactive ion etching process, such as an inductively-coupled plasma (ICP) deep reactive ion etching (DRIE) process. Such etching will occur at the portions 132 of the semiconductor layer 100 left exposed by the masking layer 130, starting at the first side 110 and forming the trench 136 as ions penetrate through the semiconductor layer 100 toward the second side 112. Preferably, the semiconductor layer 100 will be etched completely to its second side 112, such that the trench 136 extends completely through the semiconductor layer 100 to the insulating layer 122.

As noted above, the second-type region 104 of the semiconductor layer 100 in the illustrated embodiment corresponds to a n-type region. In such examples, a depleted zone 140 of the second-type region 104 will be positively charged and the etching process can be performed using positive ions such that the positive charges in the depleted zone 140 will reflect the positive etching ions back toward the center of the trench 136, thereby inhibiting formation of the footing experienced in prior methods. Formation of the footing is particularly inhibited if the depleted zone 140 of the second-type region 104 extends completely from its interface 108 with the first-type region 102 to the insulating layer 122. For this reason, it is preferable that the thickness $T_2$ of the second-type region 104 is equal to or less than its maximum depletion width $W_2$ as discussed above, such that the entire second-type region 104 is depleted. However, it is to be appreciated that the thickness $T_2$ of the second-type region 104 may be greater than its maximum depletion width $W_2$ in some examples, such that its depleted zone 140 does not extend completely to the insulating layer 122. In such examples, the depleted zone 140 can still mitigate the extent to which a footing is formed by, for example, mitigating the height of the footing from the insulating layer 122. Moreover, it is to be appreciated that in examples wherein the second-type region 104 corresponds to a p-type region, the depleted zone 140 will be negatively charged and the etching process can be performed using negative etching ions to achieve similar results.

The trench 136 formed by the etching process will have a width $W_t$ measured perpendicular to the Z axis that can vary based on its intended application. For instance, the width $W_t$ can be from about 2 μm to about 15 μm in some examples. Moreover, the width $W_t$ can be substantially constant along the Z axis from the first side 110 to the second side 112 of the semiconductor layer 100. For example, the width $W_t$ in some examples can have a maximum variance along the Z axis that is 0.5 μm or less (for the purposes of this disclosure, a "maximum variance" of a particular dimension along an axis is equal to the difference between its maximum value and minimum value along the axis). Having a substantially constant width $W_t$ can improve symmetry of the trench 136, which is particularly desirable when the trench 136 is part of, for example, a capacitor of a MEMS gyroscope or MEMS accelerometer. As can be appreciated from above, the present method can mitigate the presence of a footing in the trench 136, which improves symmetry of the trench 136.

Figure 1F:
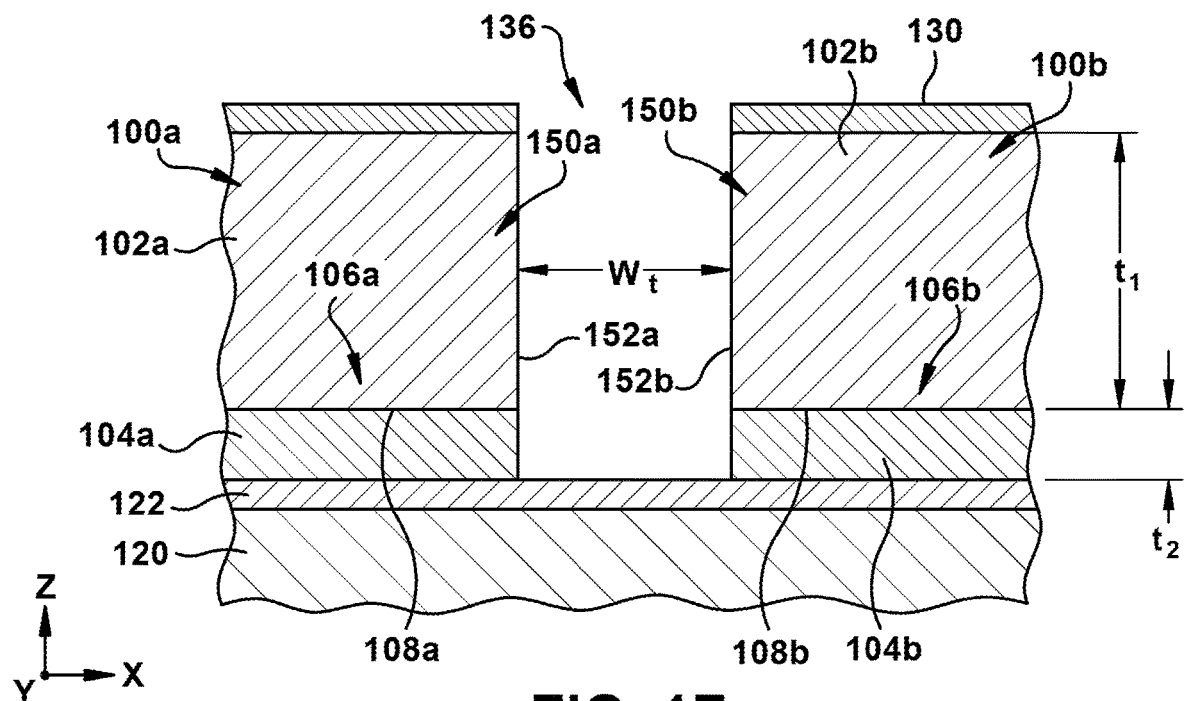
FIG. 1F is a schematic cross-section view illustrating the semiconductor layer after etching.

As shown in FIG. 1F, once the etching process is complete, the semiconductor layer 100 will be divided into a first semiconductor substrate 100a and a second semiconductor substrate 100b that are both provided on the handle substrate 120 and spaced apart by the trench 136. The first and second semiconductor substrates 100a, 100b will respectively have side portions 150a, 150b with sidewalls 152a, 152b that face each other and define the sides of the trench 136. Additionally, the first semiconductor substrate 100a will include respective portions 102a, 104a of the first- and second-type regions 102, 104 that form a first substrate p-n junction 106a at their interface 108a, while the second semiconductor substrate 100b will include respective portions 102b, 104b of the first- and second-type regions 102, 104 that form a second substrate p-n junction 106b at their interface 108b.

Since the first and second semiconductor substrates 100a, 100b are both derived from the semiconductor layer 100, they will have substantially the same composition and thicknesses as each other and the semiconductor layer 100 from which they were derived. For example, both semiconductor substrates 100a, 100b will comprise the same materials (e.g., silicon) as the original semiconductor layer 100. As another example, the first-type portions 102a, 102b of the first and second semiconductor substrates 100a, 100b will have the substantially same thickness $t_1$ and doping levels, which will correspond to the thickness $T_1$ and doping level of the original first-type region 102. Likewise, the second-type portions 104a, 104b of the first and second semiconductor substrates 100a, 100b will have the substantially same thickness $t_2$ and doping levels, which will correspond to the thickness $T_2$ and doping level of the original second-type region 104.

Furthermore, the maximum depletion widths of the second-type portions 104a, 104b will be substantially the same as the maximum depletion width $W_2$ of the original second-type region 104. Thus, in examples wherein the thickness $T_2$ of the second-type region 104 is equal to or less than its maximum depletion width $W_2$, the thicknesses $t_2$ of the second-type portions 104a, 104b will also be less than or equal to their respective maximum depletion widths.

Although the method as described above forms a single trench 136 that divides the semiconductor layer 100 into two semiconductor substrates 100a, 100b, it is to be appreciated that multiple trenches 136 can be formed to divide the semiconductor layer 100 into more than two semiconductor substrates. In such examples, the masking layer 130 described above can expose multiple portions 132 of the semiconductor layer 100 such that those portions 132 are etched to form multiple trenches 136 during the etching process. Moreover, the more than two semiconductor substrates formed by the etching process will likewise have similar compositions and thicknesses as each other and the semiconductor layer 100.

Figure 1G:
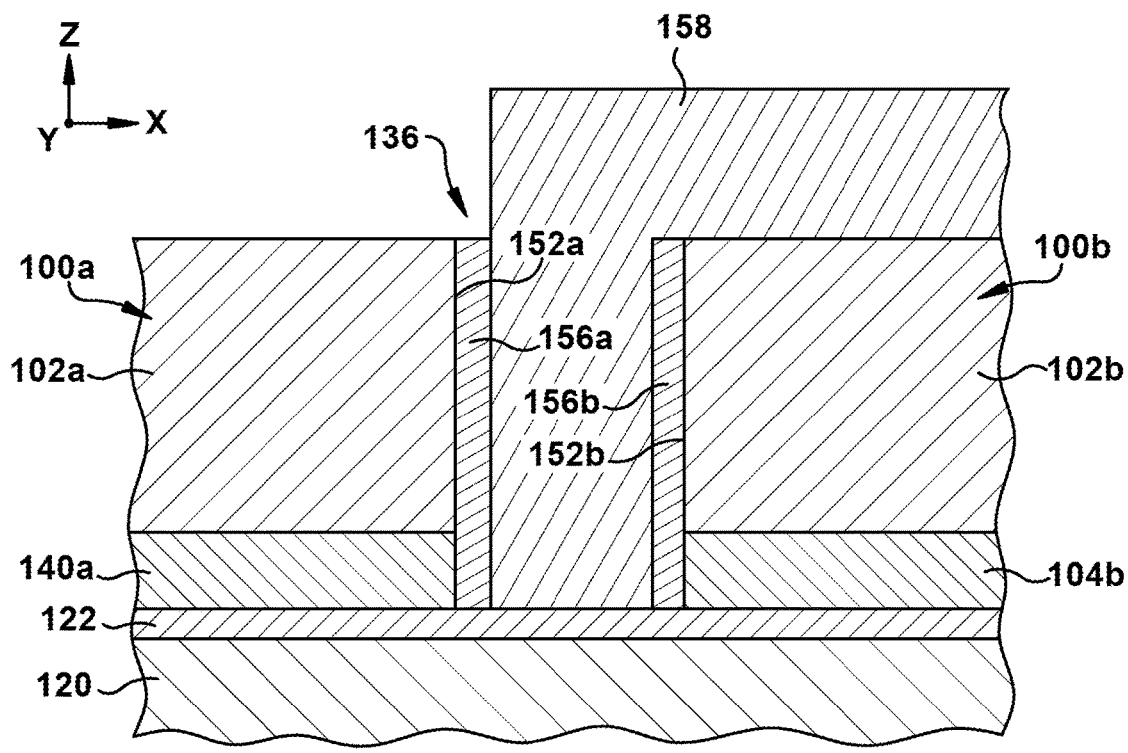
FIG. 1G is a schematic cross-section view illustrating a step of applying oxide layers to sidewalls of the trench and filling the trench with a conductive material.

Once the semiconductor layer 100 has been etched into two or more semiconductor substrates, further processing can be performed to complete manufacture of a semiconductor device. For example, as shown in FIG. 1G, the masking layer 130 can be removed. Additionally, the sidewalls 152a, 152b of the first and second semiconductor substrates 100a, 100b can be coated with oxide layers 156a, 156b (e.g., silicon dioxide layers) and then the trench 136 can be filled with a conductive material 158 (e.g., polysilicon). This conductive material 158 can extend over and be supported by one of the first and second semiconductor substrates 100a, 100b. In the present example, the conductive material 158 extends over and is supported by the first side 110b of the second semiconductor substrate 100b.

Figure 1H:
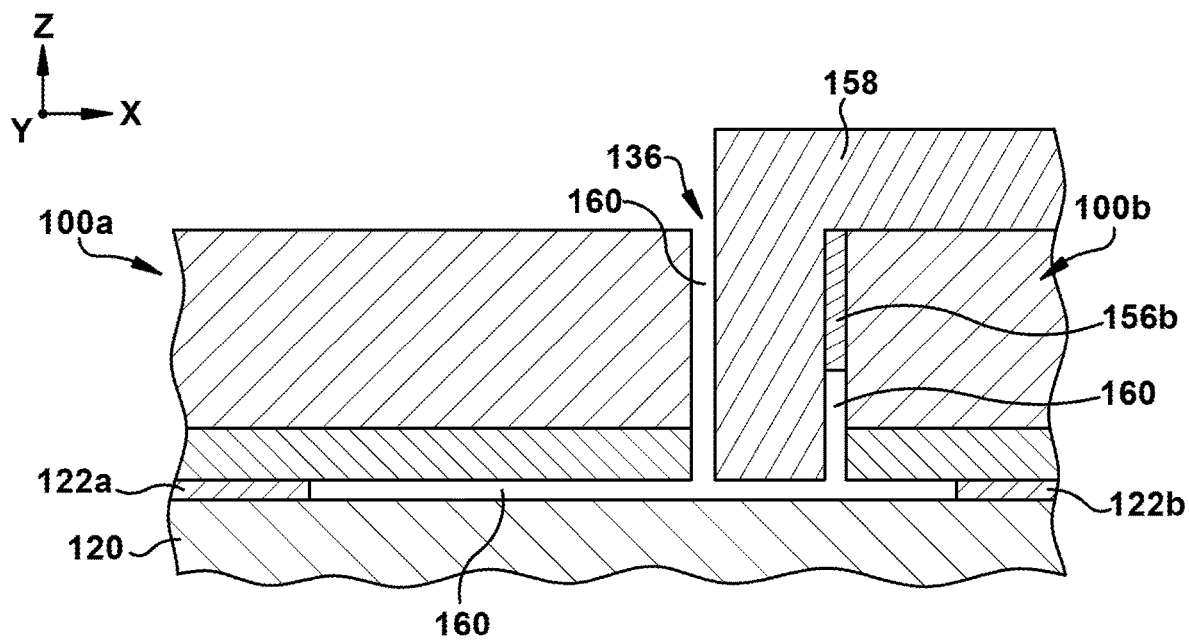
FIG. 1H is a schematic cross-section view illustrating a step of removing the oxide layers and insulating layer either partially or entirely.

Additional processing steps can include removing one or more portions of the semiconductor device. For example, as shown in FIG. 1H, the method can include removing the oxide layer 156a in its entirety, as well as a portion of the insulating layer 122 (leaving behind a first portion 122a and second portion 122b of the insulating layer 122) and a portion of the oxide layer 156b. These segments can be removed by, for example, applying hydrofluoric acid to the oxide layers 156a, 156b and insulating layer 122, although other processes of removal are possible. Moreover, an empty space 160 will be formed at the locations where these segments are removed (for the purposes of this disclosure, an "empty space" refers to a space that is void of solid structure but may contain a fluid such as air).

Figure 2:
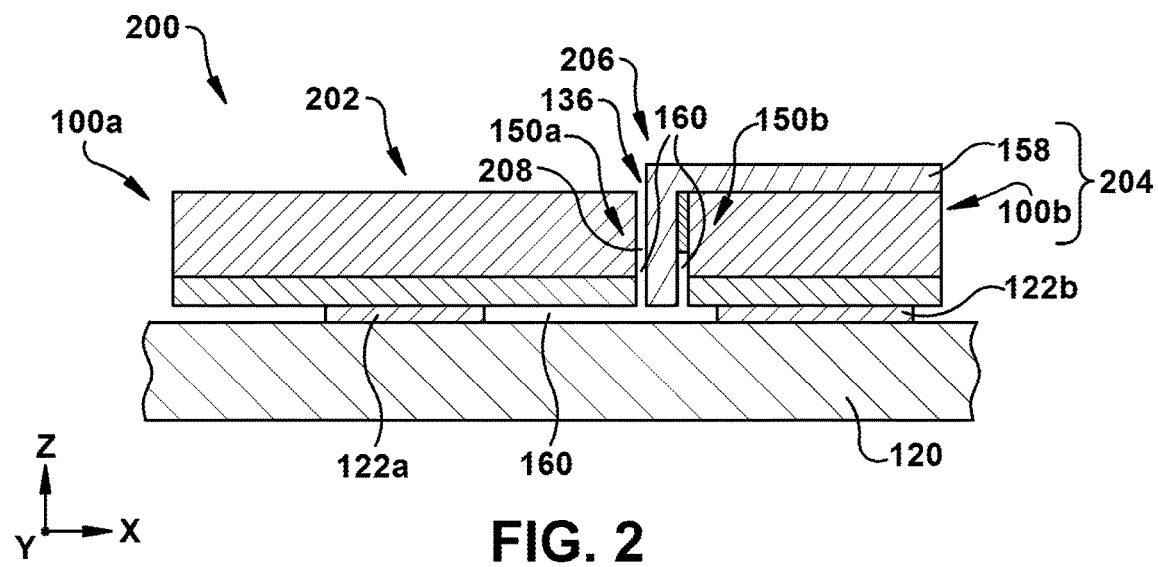
FIG. 2 is a schematic cross-section view illustrating an example semiconductor device manufactured by the steps illustrated in FIGS. 1A-1I1.
Figure 3:
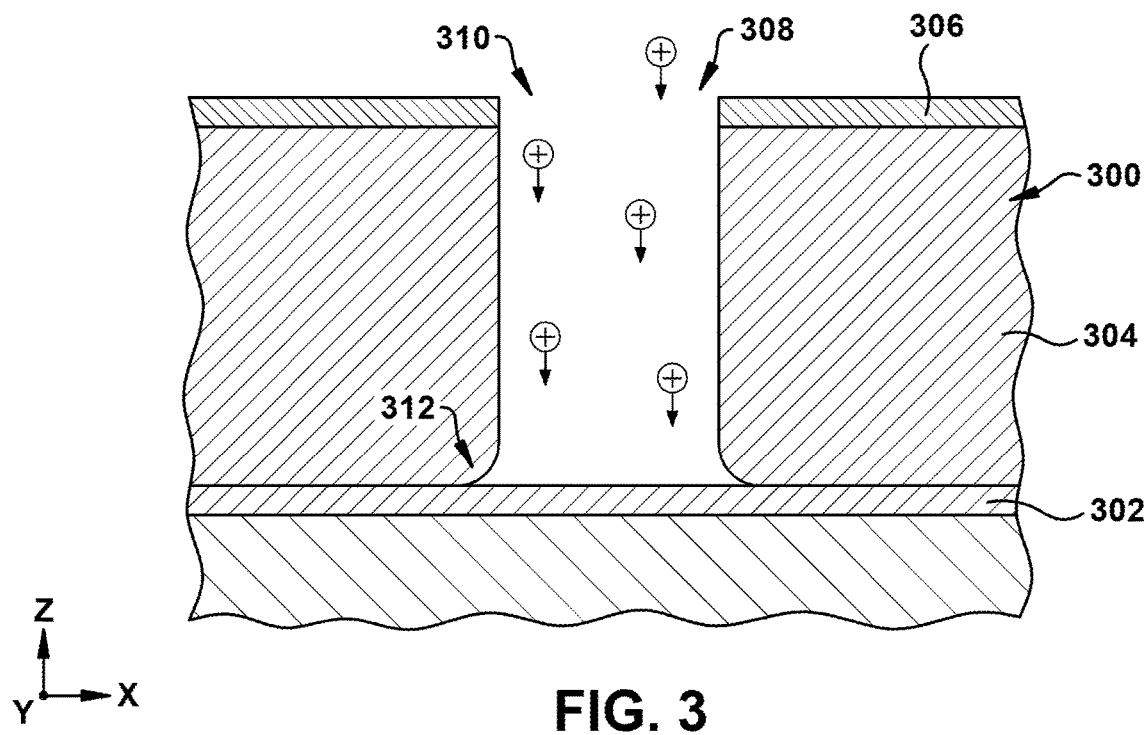
FIG. 3 is a schematic cross-section view illustrating a step of manufacturing a semiconductor device in the prior art.

FIG. 2 schematically illustrates a finished semiconductor device 200 that has been manufactured according to the method described above. The semiconductor device 200 corresponds to a MEMS gyroscope and includes a reasonator 202 formed by the first semiconductor substrate 100a and an electrode 204 formed by the second semiconductor substrate 100b and the conductive material 158 (collectively). The reasonator 202 is anchored to the handle substrate 120 by the first insulating layer portion 122a while the electrode 204 is anchored to the handle substrate 120 by the second insulating layer portion 122b. Moreover, side portions of the reasonator 202 and electrode 204 (e.g., side portions 150a, 150b of the first and second semiconductor substrates 150a, 150b and the conductive material 158 in the trench 136) will cooperate with each other to form a capacitor 206 with a capacitive gap 208 therebetween (for the purposes of this disclosure, a "capacitive gap" refers to a space that contains a dielectric material such as air).

However, it is to be appreciate the semiconductor device 200 can comprise additional and/or alternative structure in other examples. For instance, the semiconductor device 200 can exclude the conductive material 158 in some examples. In such cases, the electrode 204 can be formed by the first semiconductor substrate 100a without the conductive material 158, and the capacitor 206 can be formed by the side portions 150a, 150b of the first and second semiconductor substrates 150a, 150b with the capacitive gap 208 defined by the sidewalls 152a, 152b of the first and second semiconductor substrates 150a, 150b. Moreover, the semiconductor device 200 can correspond to other devices such as an accelerometer in some examples.

This application has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims.

What is claimed is:

1. A semiconductor device comprising:
a handle substrate;
a first semiconductor substrate provided on the handle substrate, the first semiconductor substrate having a first-type portion and a second-type portion that are stacked and interface with each other to form a first substrate p-n junction; and
a second semiconductor substrate provided on the handle substrate, the second semiconductor substrate having another first-type portion and another second-type portion that are stacked and interface with each other to form a second substrate p-n junction,
wherein the first-type portions of the first semiconductor substrate and second semiconductor substrate each correspond to one of a p-type portion and a n-type portion, and the second-type portions of the first semiconductor substrate and second semiconductor substrate each correspond to the other of the p-type portion and n-type portion,
wherein the first semiconductor substrate and the second semiconductor substrate are spaced apart by a trench, and
wherein the trench has a width with a maximum variance that is 0.5 μm or less.

2. A gyroscope comprising the semiconductor device of claim 1, wherein the first semiconductor substrate forms a resonator of the gyroscope and the second semiconductor substrate forms an electrode of the gyroscope.

3. A semiconductor device comprising:
a handle substrate;
a first semiconductor substrate provided on the handle substrate, the first semiconductor substrate having a first-type portion and a second-type portion that are stacked and interface with each other to form a first substrate p-n junction; and
a second semiconductor substrate provided on the handle substrate, the second semiconductor substrate having another first-type portion and another second-type portion that are stacked and interface with each other to form a second substrate p-n junction,
wherein the first-type portions of the first semiconductor substrate and second semiconductor substrate each correspond to one of a p-type portion and a n-type portion, and the second-type portions of the first semiconductor substrate and second semiconductor substrate each correspond to the other of the p-type portion and n-type portion,
wherein the first semiconductor substrate and the second semiconductor substrate are spaced apart by a trench, and
wherein the trench is filled with a conductive material.

4. A gyroscope comprising the semiconductor device of claim 3, wherein the first semiconductor substrate forms a resonator of the gyroscope and the second semiconductor substrate forms an electrode of the gyroscope.

5. A semiconductor device comprising:
a handle substrate;
a first semiconductor substrate provided on the handle substrate, the first semiconductor substrate having a first-type portion and a second-type portion that are stacked and interface with each other to form a first substrate p-n junction; and
a second semiconductor substrate provided on the handle substrate, the second semiconductor substrate having another first-type portion and another second-type portion that are stacked and interface with each other to form a second substrate p-n junction,
wherein the first-type portions of the first semiconductor substrate and second semiconductor substrate each correspond to one of a p-type portion and a n-type portion, and the second-type portions of the first semiconductor substrate and second semiconductor substrate each correspond to the other of the p-type portion and n-type portion, wherein the first semiconductor substrate and the second semiconductor substrate are spaced apart by a trench, and wherein the second-type portions of the first semiconductor substrate and second semiconductor substrate each has a thickness that is equal to or less than its maximum depletion width.

6. A gyroscope comprising the semiconductor device of claim 5, wherein the first semiconductor substrate forms a resonator of the gyroscope and the second semiconductor substrate forms an electrode of the gyroscope.

7. A gyroscope comprising:
a semiconductor device, the semiconductor device comprising:
a handle substrate,
a first semiconductor substrate provided on the handle substrate, the first semiconductor substrate having a first-type portion and a second-type portion that are stacked and interface with each other to form a first substrate p-n junction, and
a second semiconductor substrate provided on the handle substrate, the second semiconductor substrate having another first-type portion and another second-type portion that are stacked and interface with each other to form a second substrate p-n junction,
wherein the first-type portions of the first semiconductor substrate and second semiconductor substrate each correspond to one of a p-type portion and a n-type portion, and the second-type portions of the first semiconductor substrate and second semiconductor substrate each correspond to the other of the p-type portion and n-type portion, and
wherein the first semiconductor substrate and the second semiconductor substrate are spaced apart by a trench,
wherein the first semiconductor substrate forms a resonator of the gyroscope and the second semiconductor substrate forms an electrode of the gyroscope.

8. The semiconductor device of claim 1, wherein the first semiconductor substrate and the second semiconductor substrate each comprises silicon.

9. The semiconductor device of claim 1, wherein the trench is filled with a conductive material.

10. The semiconductor device of claim 1, wherein the first-type portions of the first semiconductor substrate and second semiconductor substrate have the substantially same doping level, and the second-type portions of the first semiconductor substrate and second semiconductor substrate have the substantially same doping level.

11. The semiconductor device of claim 1, wherein the second-type portions of the first semiconductor substrate and second semiconductor substrate each has a thickness that is equal to or less than its maximum depletion width.

12. The gyroscope of claim 2, wherein the first semiconductor substrate has a first side portion and the second semiconductor substrate has a second side portion that forms a capacitor with the first side portion.

13. The gyroscope of claim 12, wherein a capacitive gap is provided between the first side portion of the first semiconductor substrate and the second side portion of the second semi conductor substrate.

14. The semiconductor device of claim 3, wherein the first semiconductor substrate and the second semiconductor substrate each comprises silicon.

15. The semiconductor device of claim 3, wherein the first-type portions of the first semiconductor substrate and second semiconductor substrate have the substantially same doping level, and the second-type portions of the first semiconductor substrate and second semiconductor substrate have the substantially same doping level.

16. The semiconductor device of claim 3, wherein the second-type portions of the first semiconductor substrate and second semiconductor substrate each has a thickness that is equal to or less than its maximum depletion width.

17. The gyroscope of claim 4, wherein the first semiconductor substrate has a first side portion and the second semiconductor substrate has a second side portion that forms a capacitor with the first side portion.

18. The gyroscope of claim 17, wherein a capacitive gap is provided between the first side portion of the first semiconductor substrate and the second side portion of the second semi conductor substrate.

19. The semiconductor device of claim 5, wherein the first semiconductor substrate and the second semiconductor substrate each comprises silicon.

20. The semiconductor device of claim 5, wherein the first-type portions of the first semiconductor substrate and second semiconductor substrate have the substantially same doping level, and the second-type portions of the first semiconductor substrate and second semiconductor substrate have the substantially same doping level.

21. The gyroscope of claim 6, wherein the first semiconductor substrate has a first side portion and the second semiconductor substrate has a second side portion that forms a capacitor with the first side portion.

22. The gyroscope of claim 21, wherein a capacitive gap is provided between the first side portion of the first semiconductor substrate and the second side portion of the second semi conductor substrate.

23. The semiconductor device of claim 7, wherein the first semiconductor substrate and the second semiconductor substrate each comprises silicon.

24. The semiconductor device of claim 7, wherein the first-type portions of the first semiconductor substrate and second semiconductor substrate have the substantially same doping level, and the second-type portions of the first semiconductor substrate and second semiconductor substrate have the substantially same doping level.

25. The gyroscope of claim 7, wherein the first semiconductor substrate has a first side portion and the second semiconductor substrate has a second side portion that forms a capacitor with the first side portion.

26. The gyroscope of claim 25, wherein a capacitive gap is provided between the first side portion of the first semiconductor substrate and the second side portion of the second semiconductor substrate.

* * * * *